US009488699B2

(12) United States Patent
Peczalski

(10) Patent No.: US 9,488,699 B2
(45) Date of Patent: Nov. 8, 2016

(54) DEVICES FOR SENSING CURRENT

(75) Inventor: Andy M. Peczalski, Eden Prairie, MN (US)

(73) Assignee: Honeywell International Inc., Morris Plains, NJ (US)

( * ) Notice: Subject to any disclaimer, the term of this patent is extended or adjusted under 35 U.S.C. 154(b) by 205 days.

(21) Appl. No.: 13/457,014

(22) Filed: Apr. 26, 2012

(65) Prior Publication Data

US 2013/0285825 A1 Oct. 31, 2013

(51) Int. Cl.
*G08B 21/00* (2006.01)
*G01R 33/02* (2006.01)
*G01R 33/00* (2006.01)
*G01R 33/07* (2006.01)

(52) U.S. Cl.
CPC ........... *G01R 33/0011* (2013.01); *G01R 33/07* (2013.01)

(58) Field of Classification Search
CPC .......... G01R 33/0005; G01R 33/0047; G01R 33/02; G01R 33/07; G01R 33/09; G01R 33/0011; G01R 19/00; G01R 19/165; G01R 31/08; G01R 33/00; G08B 21/00
USPC ........ 340/657, 660, 664; 324/244, 251, 252, 324/260, 261
See application file for complete search history.

(56) References Cited

U.S. PATENT DOCUMENTS

| | | | | |
|---|---|---|---|---|
| 5,433,110 A * | 7/1995 | Gertz | ....................... | G01P 1/023 174/482 |
| 6,169,254 B1 * | 1/2001 | Pant | ................... | G01R 33/0206 174/254 |
| 6,429,661 B1 * | 8/2002 | Schweitzer, Jr. | .... | G01R 31/023 324/117 R |
| 6,504,366 B2 * | 1/2003 | Bodin et al. | ................... | 324/247 |
| 6,949,921 B1 * | 9/2005 | Feight | ..................... | G01R 31/42 324/126 |
| 7,095,226 B2 * | 8/2006 | Wan et al. | ...................... | 324/247 |
| 7,230,436 B2 * | 6/2007 | Terada | ................. | G01R 31/311 324/754.23 |
| 7,755,347 B1 * | 7/2010 | Cullen | ................... | G01R 15/20 324/117 H |
| 8,459,112 B2 * | 6/2013 | Rieger et al. | .............. | 73/514.16 |
| 8,558,535 B2 * | 10/2013 | Sorensen | ............. | G01R 15/246 324/96 |
| 2005/0017714 A1 * | 1/2005 | Beichler | ................ | G01R 33/04 324/247 |
| 2005/0156587 A1 * | 7/2005 | Yakymyshyn | ....... | G01R 15/207 324/117 R |
| 2006/0018643 A1 * | 1/2006 | Stavely | .................. | G03B 17/02 396/55 |
| 2009/0251308 A1 * | 10/2009 | Schweitzer et al. | ........ | 340/539.1 |
| 2010/0231198 A1 * | 9/2010 | Bose | ......................... | G01R 1/22 324/117 H |
| 2011/0074382 A1 * | 3/2011 | Patel | .................... | G01R 15/207 324/76.11 |

FOREIGN PATENT DOCUMENTS

WO 2013/063773 5/2013

* cited by examiner

*Primary Examiner* — Brian Wilson
(74) *Attorney, Agent, or Firm* — Brooks, Cameron & Huebsch, PLLC

(57) ABSTRACT

Devices for sensing current are described herein. One device includes a first magnetic sensor configured to determine a first magnetic field associated with a current conductor while the current conductor is conducting a current, a second magnetic sensor, a particular distance from the first magnetic sensor, configured to determine a second magnetic field associated with the current conductor while the current conductor is conducting the current, and a fastener configured to secure the current sensor to the current conductor such that the first and second magnetic sensors are on a plane substantially perpendicular to a longitudinal axis of the current conductor.

17 Claims, 3 Drawing Sheets

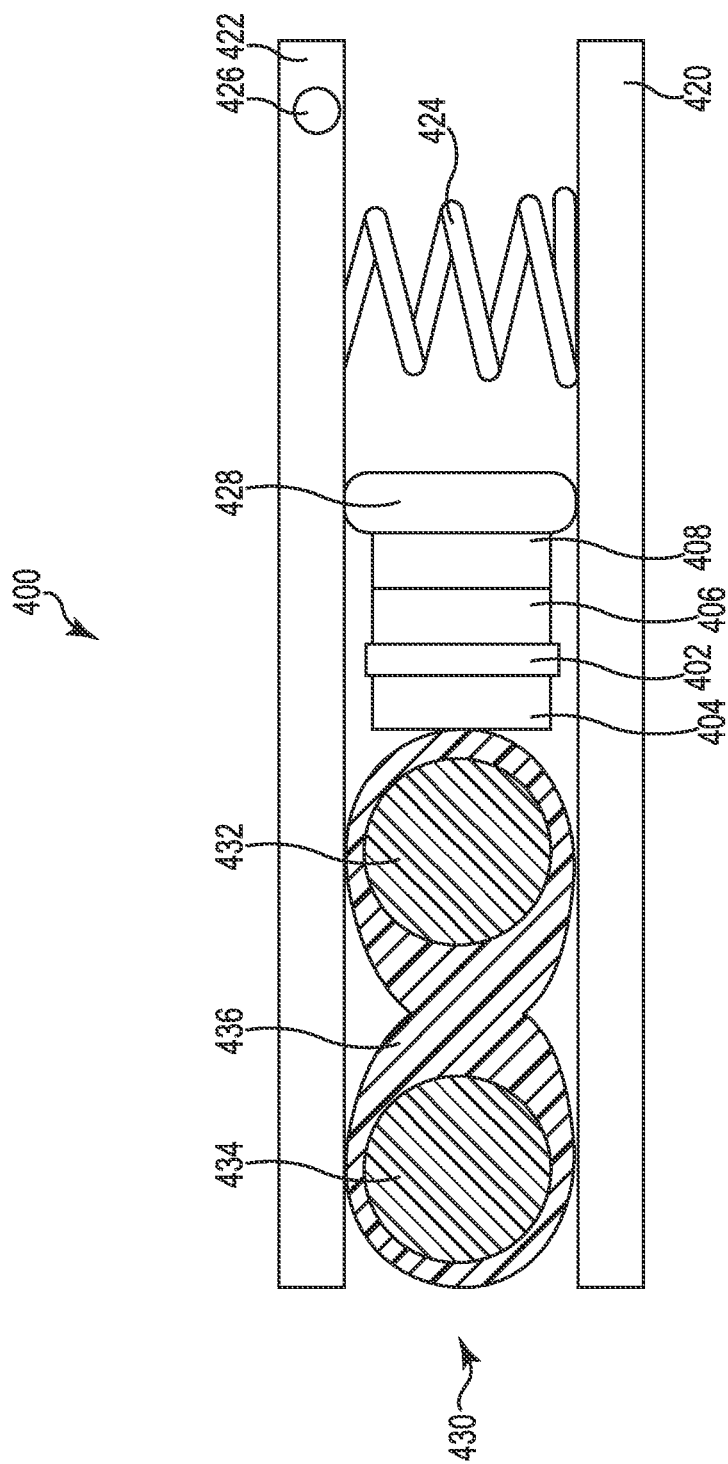

DEVICES FOR SENSING CURRENT

TECHNICAL FIELD

The present disclosure relates to devices for sensing current.

BACKGROUND

A current through a current conductor (e.g., a power cord) may be determined (e.g., sensed, acquired, and/or measured) based on a magnetic field generated by the current conductor as the current passes through the current conductor. Determining current based on a magnetic field may allow the current to be measured without interrupting current through the current conductor, for example. A determined current can be used to monitor electric power use and/or health of electric devices (e.g., refrigerators, fans, boilers, air conditioning units, etc.), for instance.

Some previous approaches for determining current based on a magnetic field may use a magnetic core to concentrate the magnetic flux produced by the current. Such approaches may, for example, place a single magnetic sensor in a gap of the magnetic core.

Approaches for determining current that use a magnetic core, however, may use a large amount of space (e.g., volume) and/or power. Additionally, such approaches may be expensive to produce because, for example, they may have a complicated structure and/or many components. Additionally, such approaches may be ineffective at sensing current in a two-wire current conductor because, for example, magnetic fields associated with two opposite current flows may exhibit a canceling effect on each other.

BRIEF DESCRIPTION OF THE DRAWINGS

FIG. 4 illustrates another current sensor in accordance with one or more embodiments of the present disclosure secured to a current conductor.

DETAILED DESCRIPTION

Figure 1:
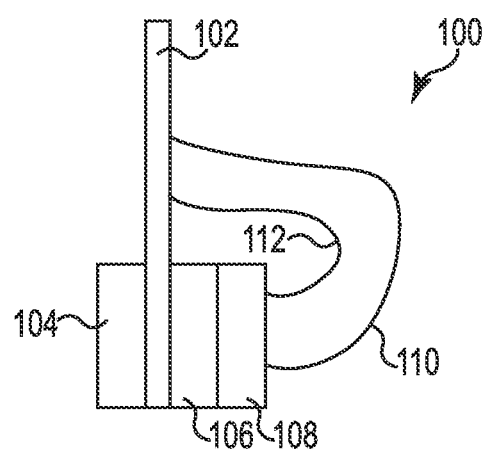
FIG. 1 illustrates a current sensor in accordance with one or more embodiments of the present disclosure.

Devices for sensing current are described herein. For example, one or more embodiments include a first magnetic sensor configured to determine a first magnetic field associated with a current conductor while the current conductor is conducting a current, a second magnetic sensor, a particular distance from the first magnetic sensor, configured to determine a second magnetic field associated with the current conductor while the current conductor is conducting the current, and a fastener configured to secure the current sensor to the current conductor such that the first and second magnetic sensors are on a plane substantially perpendicular to a longitudinal axis of the current conductor.

One or more embodiments of the present disclosure can sense a current associated with a current conductor based on a magnetic field generated by the current conductor as the current conductor conducts the current. For example, one or more embodiments of the present disclosure can sense a current without the use of a magnetic core.

Because one or more embodiments of the present disclosure can sense current without using a magnetic core, one or more embodiments of the present disclosure can sense current using a smaller amount of space (e.g., volume) and/or power than previous approaches (e.g., approaches in which current is sensed using a magnetic core). Additionally, one or more embodiments of the present disclosure can sense current using a less complicated structure and/or fewer components than previous approaches. Additionally, one or more embodiments of the present disclosure can be easily installed (e.g., secured) onto a current conductor because the current conductor does not need to be cut for installation, for example.

Additionally, one or more embodiments of the present disclosure can be contained in a single enclosure (e.g., package) to allow for ease of installation (e.g., securing) onto a current conductor. Further, embodiments of the present disclosure can provide a notification when a determined magnetic field exceeds a threshold (e.g., a maximum signal is received). Such notification can allow alignment of a sensor in accordance with embodiments of the present disclosure with one or two current conductors to increase sensing accuracy, for instance. For example, a sensor can be secured such that a number of magnetic current sensors are on a plane substantially perpendicular to a longitudinal axis of a current conductor and/or on a plane bisecting cross sections of wires of a current conductor.

Being secured such that magnetic current sensors are on a plane substantially perpendicular to a longitudinal axis of a current conductor can include positioning a sensing direction vector of the number of magnetic current sensors on the plane. For example, a sensing direction vector can be a line and/or plane crossing a center of a magnetic current sensor where sensitivity is high (e.g., greatest). Such a direction vector can be perpendicular to a surface of a magnetic current sensor (e.g., as in Hall Effect sensors), parallel to a surface of various magnetic current sensors (e.g., as in anisotropic magnetoresistance sensors), and/or a number of other orientations.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of bond wires" can refer to one or more bond wires.

FIG. 1 illustrates a current sensor 100 in accordance with one or more embodiments of the present disclosure. As illustrated in FIG. 1, current sensor 100 includes a circuit board 102, a first magnetic sensor 104, a second magnetic sensor 106, and a third magnetic sensor 108.

Although three magnetic sensors are shown, embodiments of the present disclosure are not limited to a particular number of magnetic sensors. For example, current sensor 100 can be limited to include two magnetic sensors (e.g., magnetic sensors 104 and 106) rather than three (e.g., magnetic sensors 104, 106, and 108, as illustrated in FIG. 1). Various embodiments in accordance with the present disclosure that include more than two magnetic sensors can be beneficial if the current sensor is secured to a current conductor in a tilted position, for instance. Such benefits are discussed further below in connection with FIG. 4.

Magnetic sensors 104, 106, and/or 108 can be one or more of various types of sensors (e.g., transducers) configured to sense (e.g., detect, measure, and/or acquire) magnetic field data. For example, magnetic sensors 104, 106, and/or 108 can be and/or include Hall Effect elements, giant magnetoresistance (GMR) elements, colossal magnetoresistance (CMR) elements, anisotropic magnetoresistance (AMR) elements, and/or tunneling magnetoresistance (TMR) elements, among other types of sensors. Magnetic field data can include, for example, a gradient and/or magnitude (e.g., intensity, level, and/or strength) of a magnetic field, among other magnetic field data.

Circuit board 102 can be and/or include various materials including, for example, a printed circuit board (PCB) and/or non-magnetic materials (e.g., polyamide, polyvinyl chloride, polypropylene, polycarbonate, etc.), though embodiments of the present disclosure do not limit circuit board 102 to a particular material.

Magnetic sensors 104, 106, and/or 108 can be positioned (e.g., fixed) a particular (e.g., known) distance from each other. Such a distance can be used to determine a current associated with a current conductor in a manner analogous to that discussed below in connection with FIG. 4, for instance. As illustrated in FIG. 1, embodiments of the present disclosure can fix such a distance by stacking (e.g., abutting) magnetic sensors 104, 106, and/or 108. Although such a stack is illustrated in FIG. 1, embodiments of the present disclosure do not limit the positioning of magnetic sensors 104, 106, and/or 108 to particular distances with respect to each other.

As illustrated in FIG. 1, the terminal ends of magnetic sensors 104, 106, and/or 108 can be substantially parallel (e.g., in-line) with each other. Further, as illustrated in FIG. 1, magnetic sensors 104, 106, and/or 108, can be substantially the same size (e.g., 0.3 millimeters by 0.3 millimeters), though embodiments of the present disclosure do not place limits on sizes and/or relationships between sizes of magnetic sensors as disclosed herein.

Additionally, though intentionally not illustrated in FIG. 1 for reasons of clarity and so as not to obscure embodiments of the present disclosure, magnetic sensors (e.g., magnetic sensors 104, 106, and/or 108) can be enclosed and/or packaged in an enclosure (e.g., box). Such an enclosure can additionally provide conductive shielding. To provide shielding, for example, an enclosure can be made from various conductive and/or soft magnetic materials and can surround a portion and/or the entirety of current sensor 100. Shielding can prevent external magnetic fields (e.g., fields associated with additional current conductors) from affecting magnetic field data acquisition by magnetic sensors in accordance with embodiments of the present disclosure (e.g., magnetic sensors 104, 106, and/or 108).

Additionally and/or alternatively, magnetic sensors 104, 106, and/or 108 can be, and/or be a portion of, a bare die assembly. Accordingly, such an assembly can allow magnetic sensors 104, 106, and/or 108 to be packaged at once (e.g., not individually and/or pre-packaged).

As illustrated in FIG. 1, magnetic sensors 104 and/or 106 can be connected to (e.g., surface mounted, soldered, etc.) circuit board 102 (e.g., via interconnect spacer boards, not shown in FIG. 1). Additionally and/or alternatively, magnetic sensor 108 can be connected to circuit board 102 by bond wires 110 and/or 112.

Though not illustrated in FIG. 1, magnetic sensors in accordance with one or more embodiments of the present disclosure can be positioned in different orientations. For example, magnetic sensor 108 can have a different orientation with respect to circuit board 102 than magnetic sensor 104 and/or 106. Continuing in the example, if magnetic sensors 104 and 106 are surface mounted to circuit board 102, transducers associated with magnetic sensors 104 and 106 may face away from circuit board 102.

Additionally and/or alternatively, magnetic sensor 108 can be positioned in a different manner (e.g., flipped) such that a transducer of magnetic sensor 108 faces circuit board 102, for instance. Such positioning can reduce (e.g., minimize) a distance between magnetic sensor 108 and a current conductor, providing, for example, increased sensing accuracy. Positioning can include positioning magnetic sensors 104, 106, and/or 108 such that magnetic sensors 104, 106, and/or 108 are parallel with a direction of a magnetic field associated with a current conductor (discussed below in connection with FIG. 4).

Additionally and/or alternatively, a distance between magnetic sensors 104 and 106 can be decreased (e.g., minimized) to increase sensing accuracy, for instance. Such a distance can be decreased in various ways such as, for example, using thin packages for magnetic sensors 104 and/or 106 and/or orienting magnetic sensors 104 and 106 to face each other (e.g., tops of packages facing each other) in an instance where a die of magnetic sensor 104 and/or 106 is proximal to one face of magnetic sensors 104 and/or 106 (e.g., a top of a package of magnetic sensor 104 and/or 106). Decreasing distance(s) between magnetic sensors in accordance with one or more embodiments of the present disclosure can reduce (e.g., minimize) various effects associated with additional and/or external (e.g., stray) magnetic fields and/or gradients, for instance.

Figure 2:
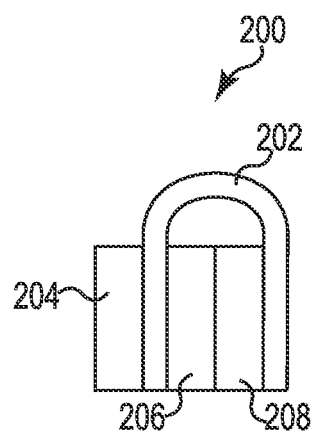
FIG. 2 illustrates another current sensor in accordance with one or more embodiments of the present disclosure.

FIG. 2 illustrates another current sensor 200 in accordance with one or more embodiments of the present disclosure. Current sensor 200 can be, in various respects, analogous to current sensor 100 previously discussed in connection with FIG. 1. For example, current sensor 200 includes a circuit board 202, a first magnetic sensor 204, a second magnetic sensor 206, and a third magnetic sensor 208.

As shown in the embodiment illustrated in FIG. 2, current sensor 200 does not include bond wires (e.g., bond wires 110 and/or 112 included in current sensor 100). As shown in FIG. 2, for example, circuit board 202 can be manipulated (e.g., flexed) such that circuit board 202 can curve around magnetic sensors 206 and/or 208. Accordingly, an outer surface (e.g., a surface opposing magnetic sensor 206) of magnetic sensor 208 can be surface mounted to circuit board 202, for instance. Use of a flexible circuit board can reduce (e.g., minimize and/or eliminate) various problems associated with wiring (e.g., breakage). Additionally, use of a flexible circuit board can reduce costs by using fewer components.

Figure 3:
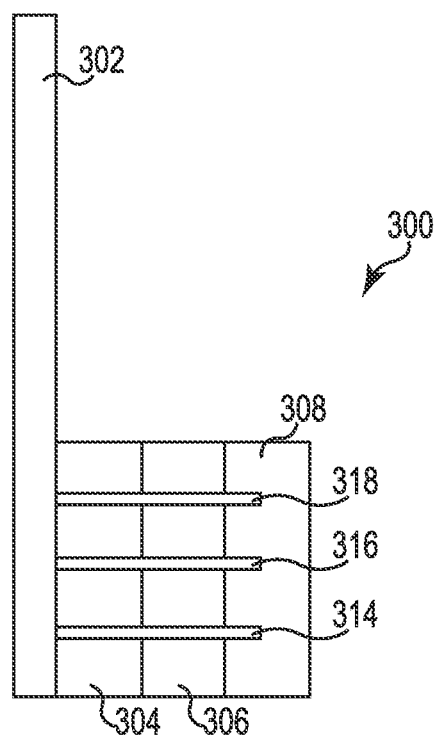
FIG. 3 illustrates another current sensor in accordance with one or more embodiments of the present disclosure.

FIG. 3 illustrates another current sensor 300 in accordance with one or more embodiments of the present disclosure. In a manner analogous to the embodiments illustrated in FIGS. 1 and 2, current sensor 300 includes a circuit board 302, a first magnetic sensor 304, a second magnetic sensor 306, and a third magnetic sensor 308. However, as shown in the embodiment illustrated in FIG. 3, the magnetic sensors 304, 306 and/or 308 can be arranged on a same side of circuit board 302. Such an arrangement can reduce installation time because, for example, magnetic sensors 304, 306, and/or 308 can be prepackaged in an enclosure (e.g., as previously discussed) and can be connected (e.g., surface mounted) to circuit board 302 simultaneously.

As illustrated in FIG. 3, current sensor 300 includes interconnect 314, interconnect 316, and interconnect 318. Interconnects 314-318 can connect pads and/or lands on the side (e.g., minor) surfaces of magnetic sensors 304, 306, and/or 308 with circuit board 302.

FIG. 4 illustrates another current sensor 400 in accordance with one or more embodiments of the present disclosure secured (e.g., fastened, clipped, etc.) to a current conductor 430. As illustrated in FIG. 4, current sensor 400 includes magnetic sensors 404, 406, and 408, and circuit board 402. Though not illustrated in FIG. 4, magnetic sensor 408 can be connected to circuit board 402 via a number of bond wires, surface mounting, and/or a number of interconnects (previously discussed in connection with FIGS. 1, 2, and/or 3, though not illustrated in FIG. 4). Additionally and/or alternatively, magnetic sensor 408 can be connected to pivot portion 428 (e.g., via surface mounting such as that illustrated in FIG. 4). Accordingly, pivot portion 428 can be and/or include a circuit board analogous to those previously discussed, for instance.

Pivot portion 428 can serve as a fulcrum for clip portion 420 and/or clip portion 422 to pivot about. Pivot portion 428 can be attached to clip portions 420 and/or 322 by various means such as, for example, solder, glue, mechanical fastener(s), etc.). Additionally and/or alternatively, pivot portion 428 and/or clip portions 420 and/or 422 can be a single article (e.g., made from molded polymer(s)). Accordingly, movement of clip portions 420 and/or 422 with respect to pivot portion 428 can be a function of material flexibility, for instance.

As shown in FIG. 4, current sensor 400 can be fastened and/or secured to (e.g., clipped onto) current conductor 430. For example, force can be exerted on the interior surface(s) of clip portion 420 and/or 422 by spring 424, causing rotation of clip portions 420 and/or 422 about pivot portion 428. Spring 424 can be selected based on size and/or weight of current sensor 400 among other considerations (e.g., temperature, environmental conditions, etc.). Although FIG. 4 illustrates current conductor 430 as having two wires, embodiments of the present disclosure do not limit the determination of current through current conductors having a particular number of wires.

Although an embodiment using clip portions and a spring is illustrated in FIG. 4, the present disclosure does not limit fasteners to the illustrated embodiments. Rather, fastener(s) can be various fasteners capable of securing sensor 400 to a current conductor (e.g., current conductor 430). For example, fasteners can include binding components (e.g., hook-and-loop fasteners, lashings, etc.), clamps, and/or various mechanical fasteners, among others.

Once secured to current conductor 430, current sensor 400 can be rotated about current conductor 430 (e.g., about a longitudinal axis of current conductor 430). Further, once secured, magnetic sensors 404, 406, and/or 408 can each determine a respective magnetic field associated with current conductor 430.

Current sensor 400 can be secured at various rotational positions with respect to a longitudinal axis of current conductor 430. FIG. 4 illustrates current sensor 400 as being secured substantially centered on a plane bisecting cross-sections of wire 432 and wire 434. Such a position may reduce (e.g., minimize) effects caused by canceling magnetic field(s) associated with wire 432 with magnetic field(s) associated with wire 434, previously discussed. To further reduce such canceling effects, current sensor 400 can be positioned within a particular distance (e.g., adjacent to and/or in contact with) current conductor 430. Accordingly, magnetic sensor 404 of current sensor 400 is shown in FIG. 4 as being positioned in contact with an insulator portion 436 of current conductor 430. Reduction of canceling effects can increase (e.g., maximize) magnetic field(s) determined by magnetic sensors 404, 406, and/or 408.

Because, for example, an increased magnetic field can increase determination accuracy, embodiments of the present disclosure can include a notification functionality 426 configured to provide a notification responsive to at least one of the determined magnetic fields (e.g., determined by magnetic sensors 404, 406, and/or 408) exceeding a threshold (e.g., a maximum determined magnetic field). Although notification functionality is shown as being located on clip portion 422, embodiments of the present disclosure do not limit location, shape, and/or size of notification functionality. Notification functionality 426 can include visual notification functionalities (e.g., light emitting diodes) and/or audio notification functionalities (e.g., a speaker), among other notification functionalities.

As previously discussed, current sensor 400 can be secured to current conductor 430. Once secured, current sensor 400 can be rotated about a longitudinal axis of current conductor 430 (e.g., rotated 360 degrees around current conductor 430). While current sensor 400 is being rotated, magnetic sensors 404, 406, and/or 408 can, for example, each determine a respective magnetic field associated with current conductor 430 at each of a plurality of rotational positions.

Upon reaching a rotational position where a magnetic field exceeds a threshold (e.g., a maximum magnetic field), magnetic sensors 404, 406, and/or 408 can induce activation of notification functionality 426. For example, upon determining a magnetic field exceeding a threshold, an LED can be activated. Such a notification can indicate a rotational position of current sensor 400 likely to produce an increased (e.g., maximized) current sensing accuracy and/or efficacy, for instance. Such a rotational position can include a position substantially parallel with a plane bisecting wires 432 and 434, and/or a position substantially perpendicular to a plane bisecting wires 432 and 434, for instance. Embodiments of the present disclosure do not limit a rotational position where a determined magnetic field exceeds a threshold to a particular position.

Once secured in a rotational positioned likely to produce an increased accuracy and/or efficacy, current sensor 400 can determine current flowing through current conductor 430 according, for example, to the formula:

$$I = \frac{H}{2\pi r^n},$$

where I can correspond to current flowing through current conductor 430; H can correspond to the determined magnetic field; r can correspond to the distance from a magnetic sensor (e.g., magnetic sensors 404, 406, and/or 408) to current conductor 430; and n can correspond to a non-ideality factor. For example, if sensor 400 is secured to current conductor 430 such that magnetic sensors 404 and 406 are parallel to a radial direction of the magnetic field, n can be assumed to be 1.

Though sensor 400 is illustrated in FIG. 4 as secured substantially centered on a plane bisecting cross-sections of wire 432 and wire 434, sensor 400 can be secured at various positions with respect to wire 432 and/or 434. For example, sensor 400 can be secured on a plane substantially perpendicular to a plane bisecting cross-sections of wire 432 and wire 434.

In such a position, magnetic sensors 404 and 406 can be positioned such that a distance from magnetic sensor 404 to each of wires 432 and 434 is substantially equal. Similarly, a distance from magnetic sensor 406 to each of wires 432 and 434 can be substantially equal. Accordingly, current sensor 400 can determine current flowing through current conductor 430 according, for example, to the formula:

$$I = \frac{2H}{2\pi r^n},$$

where n can be assumed to be 1.

Accordingly, each of the of magnetic sensors 404, 406, and/or 408 is configured to determine a current associated with current conductor 430 based on a respective determined magnetic field associated with a rotational position of current sensor 400 corresponding to the at least one determined magnetic field exceeding the threshold (e.g., the rotational position where current sensor 400 determines the maximum magnetic field). Magnetic field(s) determined by magnetic sensors 404, 406, and/or 408 can be combined (e.g., aggregated, averaged, etc.) in various manners to produce a single current determination, for instance.

If, however, sensor 400 is secured at another angle (e.g., not perpendicular and/or tilted) with respect to a longitudinal axis of current conductor 430, a third magnetic sensor (e.g., magnetic sensor 408) can, as previously discussed, be used to compensate. For example, magnetic sensor 408 can extract the radial field component to determine n if, for example, it is not equal to one (e.g., sensor 400 is tilted). Accordingly, by using a plurality (e.g., three) magnetic sensors, sensor 400 can compensate for improper installation and/or movement (e.g., over time) of sensor 400 and can determine current flowing through current conductor 430.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A current sensor, comprising:
   a first magnetic sensor mounted on a first face of a circuit board and configured to determine a first magnetic field associated with a current conductor while the current conductor is conducting a current;
   a second magnetic sensor mounted on the first face of the circuit board and configured to determine a second magnetic field associated with the current conductor while the current conductor is conducting the current, wherein the circuit board curves around the first magnetic sensor and the second magnetic sensor such that the first magnetic sensor abuts the second magnetic current sensor; and
   a fastener configured to secure the current sensor to the current conductor such that each magnetic sensor of the current sensor is on a single radial line extending outward from a point on or within the current conductor, and the first magnetic sensor is disposed between the second magnetic sensor and the current conductor.

2. The current sensor of claim 1, wherein at least one of the magnetic sensors includes a tunneling magnetoresistance element.

3. The current sensor of claim 1, wherein at least one of the magnetic sensors includes an anisotropic magnetoresistance element.

4. The current sensor of claim 1, wherein the current sensor includes a third magnetic sensor connected to a second face of the circuit board.

5. The current sensor of claim 1, wherein the circuit board is a flexible printed circuit board including at least one of polyamide, polyester, polyvinyl chloride, and polypropylene.

6. The current sensor of claim 1, wherein the current sensor includes a notification functionality configured to provide a notification responsive to the first and second magnetic sensors determining the first and second magnetic fields, respectively.

7. The current sensor of claim 1, wherein the first and second magnetic sensors are individually packaged.

8. A current sensor, comprising:
   a first magnetic sensor mounted on a first portion of a first face of a circuit board;
   a second magnetic sensor mounted on a second portion of the first face of the circuit board and disposed on a surface of the first magnetic sensor opposing the first portion of the first face of the circuit board;
   a third magnetic sensor disposed on a second face of the circuit board; and
   a fastener configured to secure the current sensor to a current conductor such that each magnetic sensor of the current sensor is on a single radial line extending outward from a point on or within the current conductor, and the first magnetic sensor is disposed between the second magnetic sensor and the current conductor.

9. The current sensor of claim 8, wherein the first and second magnetic sensors have a first orientation with respect to the circuit board and the third magnetic sensor has a second orientation with respect to the circuit board.

10. The current sensor of claim 8, wherein:
the first, second, and third magnetic sensors are individually packaged.

11. A current sensor, comprising:
a fastener configured to secure the current sensor to a current conductor, while the current conductor is conducting a current, wherein upon being secured, the current sensor is rotatable about a longitudinal axis of the current conductor;
a plurality of magnetic sensors, wherein each magnetic sensor of the current sensor is on a single radial line extending outward from a point on or within the current conductor such that, upon being secured, a first magnetic sensor of the plurality of magnetic sensors mounted on a first face of a circuit board abuts and is disposed between a second magnetic sensor of the plurality of sensors mounted on the first face of the circuit board and the current conductor, wherein the circuit board curves around the first magnetic sensor and the second magnetic sensor, and wherein each magnetic sensor of the current sensor is configured to determine a respective magnetic field associated with the current conductor at each of a plurality of rotational positions while the current sensor is being rotated about the longitudinal axis of the current conductor; and
a notification functionality configured to provide a notification responsive to at least one of the determined magnetic fields exceeding a threshold.

12. The current sensor of claim 11, wherein the current sensor is configured to be secured to the current conductor such that a third magnetic sensor of the plurality of magnetic sensors contacts the current conductor.

13. The current sensor of claim 11, wherein the fastener includes a plurality of clip portions, each configured to engage the current conductor.

14. The current sensor of claim 13, wherein the fastener includes a pivot portion connecting the plurality of clip portions.

15. The current sensor of claim 11, wherein the current sensor is configured to determine the current conducted by the current conductor based, at least in part, on the at least one determined magnetic field associated with a rotational position of the current sensor corresponding to the respective determined magnetic fields exceeding the threshold.

16. The current sensor of claim 15, wherein the current sensor is configured to combine the plurality of magnetic fields determined by the plurality of magnetic sensors.

17. The current sensor of claim 11, wherein the notification functionality includes a light emitting diode.

* * * * *